United States Patent
Qi et al.

(10) Patent No.: US 10,439,007 B2
(45) Date of Patent: Oct. 8, 2019

(54) OLED DISPLAY PANEL, METHOD OF FABRICATING THE SAME AND DISPLAY APPARATUS HAVING THE SAME

(71) Applicants: BOE TECHNOLOGY GROUP CO., LTD., Beijing (CN); BEIJING BOE DISPLAY TECHNOLOGY CO., LTD., Beijing (CN)

(72) Inventors: Yonglian Qi, Beijing (CN); Lianjie Qu, Beijing (CN); Bingqiang Gui, Beijing (CN); Hebin Zhao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/735,974

(22) PCT Filed: Jun. 30, 2017

(86) PCT No.: PCT/CN2017/091036
§ 371 (c)(1),
(2) Date: Dec. 13, 2017

(87) PCT Pub. No.: WO2018/120710
PCT Pub. Date: Jul. 5, 2018

(65) Prior Publication Data
US 2019/0006428 A1  Jan. 3, 2019

(30) Foreign Application Priority Data
Dec. 27, 2016 (CN) .......................... 2016 1 1228029

(51) Int. Cl.
*H01L 29/08* (2006.01)
*H01L 27/32* (2006.01)
(Continued)

(52) U.S. Cl.
CPC ........ *H01L 27/322* (2013.01); *H01L 51/5253* (2013.01); *H01L 51/56* (2013.01); *H01L 51/5284* (2013.01)

(58) Field of Classification Search
CPC ...................................................... H01L 27/322
(Continued)

(56) References Cited

U.S. PATENT DOCUMENTS 9,247,613 B2    1/2016  Yang et al.
2015/0145405 A1*  5/2015  Yang ................... H01L 27/3211
                                                          313/498
(Continued)

FOREIGN PATENT DOCUMENTS

CN    103227189 A    7/2013
CN    103474451 A    12/2013
(Continued)

OTHER PUBLICATIONS

International search report dated Sep. 15, 2017 for corresponding application PCT/CN2017/091036 with English translation attached.
(Continued)

*Primary Examiner* — Ajay Arora
(74) *Attorney, Agent, or Firm* — Nath, Goldberg & Meyer; Joshua B. Goldberg; Daniel Bissing

(57) ABSTRACT

An OLED display panel, a fabricating method, and a display apparatus are disclosed. The OLED display panel includes a base substrate; an anode layer, a cathode layer and an organic light emitting layer between the anode layer and the cathode layer arranged on the base substrate, the organic light emitting layer being configured to emit light having third color; and first light emitting unit, second light emitting unit and third light emitting unit arranged on a light emitting side of the organic light emitting layer and independent from each other, and configured to emit, under the action of the (Continued)

light having the third color, light having a first color, light having a second color and light having the third color, respectively, the light having the first color, the light having the second color and the light having the third color being configured to generate white light when being mixed.

13 Claims, 2 Drawing Sheets

(51) Int. Cl.
*H01L 51/52* (2006.01)
*H01L 51/56* (2006.01)

(58) Field of Classification Search
USPC .......................................................... 257/40
See application file for complete search history.

(56) References Cited

U.S. PATENT DOCUMENTS

| | | |
|---|---|---|
| 2015/0228697 A1 | 8/2015 | Liu et al. |
| 2016/0204167 A1 | 7/2016 | Jun |

FOREIGN PATENT DOCUMENTS

| | | | | |
|---|---|---|---|---|
| CN | 105304684 A | | 2/2016 | |
| CN | 105576004 A | | 5/2016 | |
| CN | 105576006 A | * | 5/2016 | ............... G02B 1/00 |
| CN | 106531773 A | | 3/2017 | |
| CN | 106684112 A | | 5/2017 | |
| CN | 206727073 U | | 12/2017 | |

OTHER PUBLICATIONS

First Office Action dated Feb. 28, 2019, for corresponding Chinese application 201611228029.0 with English translation.

* cited by examiner

| organic light emitting layer -4.5V | | | organic light emitting layer + first/second light emitting units + organic color filter layers | | |
|---|---|---|---|---|---|
| cd/m² | x | y | cd/m² | x | y |
| 627.6 | 0.133 | 0.0549 | 17.34 | 0.6693 | 0.2973 |
| | | | 26.24 | 0.6818 | 0.2996 |
| | | | 62.03 | 0.6982 | 0.2976 |

OLED DISPLAY PANEL, METHOD OF FABRICATING THE SAME AND DISPLAY APPARATUS HAVING THE SAME

TECHNICAL FIELD

The present disclosure relates to the field of display technology, and particularly to an OLED display panel, a method of fabricating the same, and a display apparatus having the same.

BACKGROUND

The principle of light emission in the organic light-emitting diode (OLED) display technology is different from that in the liquid crystal display (LCD) technology. The OLEDs can be divided into a monochrome type, a multi-color type and a full-color type.

In the related art, a flexible full-color OLED display panel having a top-emission structure mainly includes a base substrate, an organic light emitting layer on the base substrate, a thin film transistor (TFT) structure for driving the organic light emitting layer, a thin film encapsulation layer for a thin film encapsulation of the organic light emitting layer, and the like. The organic light emitting layer includes a red light emitting unit, a green light emitting unit and a blue light emitting unit.

SUMMARY

In one aspect, embodiments of the present disclosure provide an OLED display panel, including:

a base substrate;

an anode layer, a cathode layer and an organic light emitting layer between the anode layer and the cathode layer arranged on the base substrate, the organic light emitting layer being configured to emit light having a third color; and a first light emitting unit, a second light emitting unit and a third light emitting unit arranged on a light emitting side of the organic light emitting layer and independent from each other, and configured to emit, under the action of the light having the third color, light having a first color, light having a second color and light having the third color, respectively, the light having the first color, the light having the second color and the light having the third color being configured to generate white light when being mixed.

Optionally, the OLED display panel further includes a thin film encapsulation layer configured to encapsulate the organic light emitting layer and the light emitting units.

Optionally, the light having the third color is blue light, the first light emitting unit is a first transparent material layer doped with red quantum dots, the second light emitting unit is a second transparent material layer doped with green quantum dots, and the third light emitting unit is a third transparent material layer doped with blue quantum dots.

Optionally, the light having the third color is blue light, the first light emitting unit is a first transparent material layer doped with red quantum dots, the second light emitting unit is a second transparent material layer doped with green quantum dots, and the third light emitting unit is a fourth transparent material layer that is colorless.

Optionally, when the third light emitting unit is the fourth transparent material layer that is colorless, the third light emitting unit and the thin film encapsulation layer are formed as an integral structure and made of a same material.

Optionally, the organic light emitting layer is an organic electroluminescent layer formed by evaporation method and having a whole layer structure covering the whole of the base substrate; and each of the first light emitting unit and the second light emitting unit is a structure of a photoluminescence layer formed by lithography method or ink-jet printing method.

Optionally, the OLED display panel further includes an anti-reflection film layer formed on a light outgoing side of the thin film encapsulation layer and configured to reduce a reflectivity of external light.

Optionally, the anti-reflection film layer includes:

a first color filter layer provided in correspondence with the first light emitting unit;

a second color filter layer provided in correspondence with the second light emitting unit; and a third color filter layer provided in correspondence with the third light emitting unit.

Optionally, each of the first color filter layer, the second color filter layer and the third color filter layer is an organic color filter layer formed by evaporation method, ink-jet printing method, or lithography method.

As another aspect, embodiments of the present disclosure provide a display apparatus including any one of the above OLED display panels.

As yet another aspect, embodiments of the present disclosure provide a method of fabricating an OLED display panel, including:

providing a base substrate;

forming, on the base substrate, an anode layer, a cathode layer and an organic light emitting layer between the anode layer and the cathode layer, the organic light emitting layer being configured to emit light having a third color when driven by an electric field between the anode layer and the cathode layer;

forming, on a light emitting side of the organic light emitting layer, a first light emitting unit, a second light emitting unit and a third light emitting unit that are independent from each other, the first light emitting unit, the second light emitting unit and the third light emitting unit being configured to emit, under the action of the light having the third color, light having a first color, light having a second color and light having the third color, respectively, the light having the first color, the light having the second color and the light having the third color being configured to generated white light when being mixed.

Optionally, the method further includes forming a thin film encapsulation layer by thin film encapsulation method, the thin film encapsulation layer being configured to encapsulate the organic light emitting layer and the light emitting units.

Optionally, in the method, the step of forming, on the light emitting side of the organic light emitting layer, the first light emitting unit, the second light emitting unit and the third light emitting unit that are independent from each other includes forming the first light emitting unit and the second light emitting unit successively by lithography method or ink-jet printing method.

Optionally, the third light emitting unit and the thin film encapsulation layer are made of a same material and are integrally and concurrently formed.

Optionally, the method further includes forming the third light emitting unit by lithography method or ink-jet printing method.

Optionally, in the method, the step of forming, on the base substrate, the anode layer, the cathode layer and the organic light emitting layer between the anode layer and the cathode layer includes forming, on the base substrate, the organic light emitting layer covering the whole of the base substrate by evaporation method.

Optionally, the method further includes forming an anti-reflection film layer for reducing a reflectivity of external light on a light outgoing side of the thin film encapsulation layer.

Optionally, the step of forming the anti-reflection film layer for reducing the reflectivity of external light on the light outgoing side of the thin film encapsulation layer includes forming, by evaporation method, lithography method or ink-jet printing method, a first color filter layer in correspondence with the first light emitting unit, a second color filter layer in correspondence with the second light emitting unit, and a third color filter layer in correspondence with the third light emitting unit successively.

DETAILED DESCRIPTION

Figure 1:
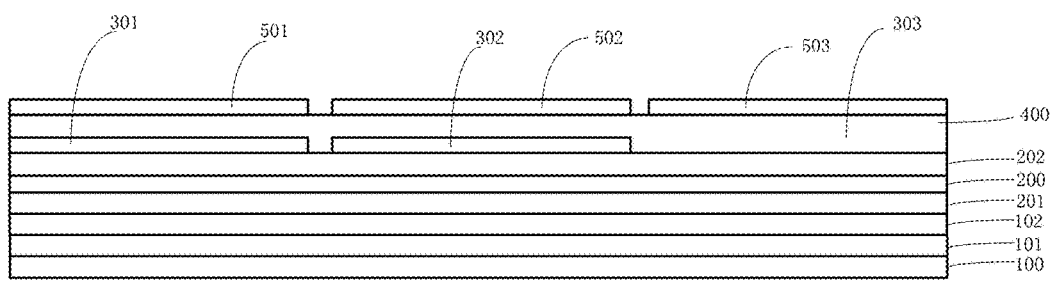
FIG. 1 is a schematic diagram illustrating the structure of an OLED display panel in some embodiments of the present disclosure.

Next, the technical solutions provided by embodiments of the present disclosure will be clearly and completely described below in conjunction with the accompanying drawings, so that the technical solutions and advantages provided by the embodiments of the present disclosure will become apparent. Obviously, the embodiments described herein are merely some, but not all of embodiments of the present disclosure. All other embodiments derived from the described embodiments of the present disclosure by those of ordinary skill in the art belong to the protection scope of the present disclosure.

The principle of light emission in the organic light-emitting diode (OLED) display technology is different from that in the liquid crystal display (LCD) technology. OLED display technology has advantages such as self-illumination, wide viewing angle, high contrast ratio, low power consumption, extremely high response speed, and the like. The OLEDs can be divided into a monochrome type, a multi-color type and a full-color type. The fabrication of a full-color OLED is the most difficult.

In the related art, a flexible full-color OLED display panel having a top-emission structure mainly includes a base substrate, an organic light emitting layer on the base substrate, a thin film transistor (TFT) structure for driving the organic light emitting layer, a thin film encapsulation layer for a thin film encapsulation of the organic light emitting layer, and the like. The organic light emitting layer includes a red light emitting unit, a green light emitting unit and a blue light emitting unit.

In the related art, because each of the red light emitting unit, the green light emitting unit and the blue light emitting unit is an organic electroluminescent layer that is formed through an evaporation process, an expensive material is used, fine metal masks (FMMs) are required to be prepared, and a flexible fabrication process is difficult to be applied to large size products, resulting in a low product yield and high cost. Moreover, the OLED display panel in the related art requires a circular polarizer being attached thereto after the encapsulation is completed, thereby avoiding reflection caused by entrance of the external light. However, the circular polarizer is not easy to bend and has a relatively large thickness. Thus, it impedes achievement of the optimum flexible effect of the flexible display panel.

In view of the problems existing in an OLED display panel of the related art (that is, because each of the light emitting units of three colors in the organic light emitting layer of the OLED display panel is formed through an evaporation process, the material is expensive, and a flexible fabrication process is difficult to be applied to large size products, resulting in a low product yield and high cost), the present disclosure provides an OLED display panel, a method of fabricating the same, and a display apparatus having the same, which are capable of achieving a flexible fabrication process of large size products, improving product yield, and lowering cost. Moreover, a wider color gamut can be achieved compared to that of an OLED display panel in the related art.

As shown in FIG. 1, an OLED display panel provided by the present disclosure includes:

a base substrate 100;

an anode layer 201 and a cathode layer 202 arranged on the base substrate 100;

an organic light emitting layer 200 between the anode layer 201 and the cathode layer 202, the organic light emitting layer 200 configured to emit light having a third color when driven by an electric field between the anode layer 201 and the cathode layer 202;

a first light emitting unit 301, a second light emitting unit 302 and a third light emitting unit 303 arranged on a light emitting side of the organic light emitting layer 200 and independent from each other, and configured to, under the action of the light having the third color, emit light having a first color, light having a second color and light having the third color, respectively, the light having the first color, the light having the second color and the light having the third color being capable of being mixed into white light.

It should be noted that the light emitting side of the organic light emitting layer 200 may be provided with a plurality of groups of the three-color light emitting units, and respective groups of the three-color light emitting units may be arranged in a matrix form and correspond to respective pixel areas.

The OLED display panel according to the present disclosure has the organic light emitting layer 200 formed on the base substrate 100. The organic light emitting layer 200 is an organic electroluminescent layer. The organic light emitting layer 200 may be formed by an evaporation process or the like, and is capable of emitting light having the third color when driven by the electric field between the cathode layer 202 and the anode layer 201. The first light emitting unit 301 and the second light emitting unit 302 formed on the light emitting side of the organic light emitting layer 200 may be photoluminescence layers (the third light emitting unit 303 may also be a photoluminescence layer) and emit light having the first color and light having the second color under the excitation of the light from the organic light emitting layer 200. In addition to evaporation process, the first light emitting unit 301 and the second light emitting unit 302 may be formed by other process such as lithography, ink-jet printing or the like. Thus, it solves the problems existing in an OLED display panel of the related art (that is, because each of the three-color light emitting units is formed through an evaporation process, an expensive material is used, FMMs are required to be prepared, and a flexible fabrication process is difficult to be applied to large size products, resulting in a low product yield and high cost). Further, according to embodiments provided by the present disclosure, the first light emitting unit 301 and the second light emitting unit 302 (as well as the third light emitting unit 303, if needed) are photoluminescence layers emitting fluorescent light under the excitation of the light from the organic light emitting layer 200. The fluorescent light has a narrower FWHM (full-width at haft-maximum) and a purer spectrum, and thus it is possible to achieve a wider color gamut compared to an OLED display panel in the related art, which is formed through an evaporation process.

As shown in FIG. 1, the OLED display panel in some embodiments of the present disclosure further includes a thin film encapsulation layer 400 configured to encapsulate the organic light emitting layer 200 and the light emitting units.

By having this design, with the thin film encapsulation (TFE), the organic light emitting layer 200 and the light emitting units are overlaid with a layer of the thin film encapsulation layer 400, thereby preventing the organic light emitting layer 200 and the light emitting units from being damaged by moisture.

In some embodiments of the present disclosure, optionally, the light having the third color is blue light, the first light emitting unit 301 includes a first transparent material layer doped with red quantum dots, the second light emitting unit 302 includes a second transparent material layer doped with green quantum dots, and the third light emitting unit 303 includes a fourth transparent material layer that is colorless.

By having this design, the blue light has a short wavelength and high energy, and the fluorescent light having red color or green color can be generated under the excitation of the blue light. Therefore, in the above embodiments, the light emitted from the organic light emitting layer 200 is the blue light, while the first and second light emitting units 301 and 302 are formed by doping transparent material layers with quantum dots having different colors to achieve photoluminescence function, and emit red light and green light, respectively, under the recitation of the blue light from the organic light emitting layer 200; and the third light emitting unit 303 may be directly formed as a transparent material layer that is colorless without being doped with any quantum dots, such that the blue light emitted from the organic light emitting layer 200 can directly pass through the third light emitting unit 303.

In the above embodiments, optionally, as shown in FIG. 1, the third light emitting unit 303 and the thin film encapsulation layer 400 are formed as an integral structure and are made of a same material. It should be noted that respective shapes and boundaries of the third light emitting unit 303 and the thin film encapsulation layer 400 are not illustrated in FIG. 1, but can refer to those depicted in FIG. 2. The difference between the structure of FIG. 1 and the structure of FIG. 2 lies in that the third light emitting unit 303 and the thin film encapsulation layer 400 in FIG. 1 are made of a same material.

By having this design, because the third light emitting unit 303 is a transparent material layer that is colorless, the third light emitting unit 303 may not be formed separately, but may be formed, in an area corresponding to the third light emitting unit 303, integrally with the thin film encapsulation layer 400 when the thin film encapsulation layer 400 is formed in the TFE encapsulation process that is performed after the formation of the organic light emitting layer 200, the first light emitting unit 301 and the second light emitting unit 302, thereby simplifying the fabrication process. In other embodiments, the third light emitting unit 303 may be formed independent of the thin film encapsulation layer 400. That is, the first, second and third light emitting units 301, 302 and 303 may be formed at first, and then the thin film encapsulation layer 400 for encapsulating the organic light emitting layer 200 and the light emitting units is formed, the third light emitting unit 303 and the thin film encapsulation layer 400 being made of a same transparent material that is colorless.

Moreover, in some embodiments of the present disclosure, optionally, the organic light emitting layer 200 is an organic electroluminescent layer formed by evaporation method and having a whole layer structure covering the whole of the base substrate 100; and each of the first light emitting unit 301 and the second light emitting unit 302 is a structure of a photoluminescence layer formed by lithography method or ink-jet printing method.

By having this design, in the OLED display panel provided by the embodiments of the present disclosure, a whole layer of the organic light emitting layer 200 (i.e., a blue light electroluminescent layer) can be formed by an evaporation process. On the other hand, the first light emitting unit 301 and the second light emitting unit 302 are formed by a process of preparing transparent material layers doped with quantum dots, in which the quantum dots are added into transparent glue layers, and forming, by a lithography process or an ink-jet printing process, the transparent glue layers doped with quantum dots having different colors in areas corresponding to the first light emitting unit 301 and the second light emitting unit 302 into the first light emitting unit 301 and the second light emitting unit 302, respectively. After that, the TFE encapsulation process is performed such that the third light emitting unit 303 and the thin film encapsulation layer 400 are formed concurrently. Because the first light emitting unit 301 and the second light emitting unit 302 can be formed by a lithography process or an ink-jet printing process, FMMs are no longer required, thereby facilitating flexible fabrication process of large size products, improving product yield, and lowering cost.

Figure 2:
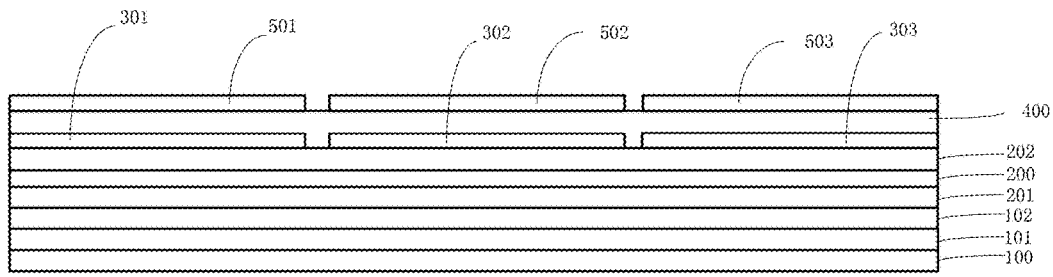
FIG. 2 is a schematic diagram illustrating the structure of an OLED display panel in some embodiments of the present disclosure.

It should be noted that, in the above embodiments, the third light emitting unit 303 is a transparent material layer that is colorless. However, in other embodiments provided by the present disclosure, the third light emitting unit 303 may be formed from a third transparent material layer doped with blue quantum dots, as shown in FIG. 2. Moreover, optionally, the third light emitting unit 303 may be a photoluminescence layer formed by a lithography process or an ink-jet printing process, similar to the first and second light emitting units 301 and 302.

Moreover, the OLED display panel in some embodiments of the present disclosure further includes an anti-reflection film layer formed on a light outgoing side of the thin film encapsulation layer 400 and configured to reduce the reflectivity of external light.

By having this design, an additional anti-reflection film layer is formed on the light outgoing side of the thin film encapsulation layer 400, thereby reducing reflection and fluorescence excitation caused by incident external light.

Optionally, as shown in FIG. 1, in some embodiments of the present disclosure, the anti-reflection film layer is an organic color filter layer, which includes:

a first color filter layer 501 provided in correspondence with the first light emitting unit 301;

a second color filter layer 502 provided in correspondence with the second light emitting unit 302; and a third color filter layer 503 provided in correspondence with the third light emitting unit 303.

By having this design, after the encapsulation, the organic color filter layer, which is an organic layer and has a thickness smaller than or equal to 3 µm, can be formed on the thin film encapsulation layer 400, such that the OLED display panel not only has a reduced overall thickness, but also is easy to bend.

Obviously, it can be understood that the anti-reflection film layer may be formed by other methods. For example, the anti-reflection film layer may be a circular polarizer. However, the circular polarizer is not easy to bend and has a relatively large thickness, which impedes achievement of the optimum flexible effect.

Moreover, in some embodiments of the present disclosure, optionally, the first color filter layer 501, the second color filter layer 502 and the third color filter layer 503 are organic color filter layers formed by evaporation method, ink-jet printing method, or lithography method.

By having this design, the first color filter layer 501, the second color filter layer 502 and the third color filter layer 503 may be ordinary organic color filter layers (CF) formed by an evaporation process, an ink-jet printing process, or a lithography process. Optionally, the first color filter layer 501, the second color filter layer 502 and the third color filter layer 503 are formed by lithography method. In a case where the first light emitting unit 301 and the second light emitting unit 302 are formed by lithography method, the masks for fabricating the first light emitting unit 301 and the second light emitting unit 302 can be directly used for fabricating the first color filter layer 501 and the second color filter layer 502; and in a case where the first light emitting unit 301, the second light emitting unit 302 and the third light emitting unit 303 are formed by lithography method, the masks for fabricating the first light emitting unit 301, the second light emitting unit 302 and the third light emitting unit 303 can be directly used for fabricating the first color filter layer 501, the second color filter layer 502 and the third color filter layer 503, thereby reducing the cost of the masks and lowering the cost.

Moreover, it should be noted that the OLED display panel provided by the embodiments of the present disclosure may further include a PI film 101, a low temperature polysilicon thin film transistor (LTPS TFT) 102, and the like, on the base substrate 100, as shown in FIG. 1.

Figures 3, 4:
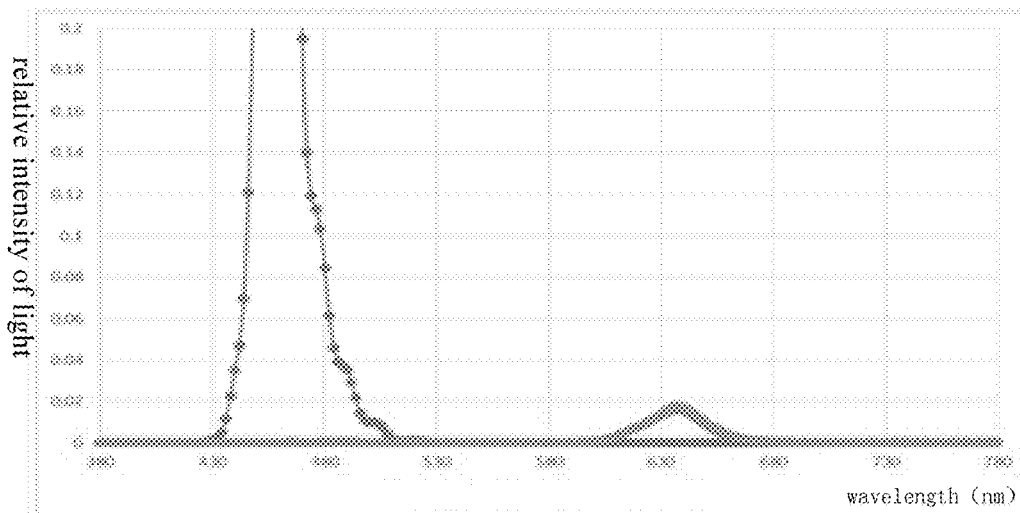
FIG. 3 is a spectrogram of light emitted from a first light emitting unit and a second light emitting unit under the excitation of blue light emitted from an organic light emitting layer of an OLED display panel in some embodiments of the present disclosure.
FIG. 4 is a comparison table of blue light brightness value of an organic light emitting layer not provided with the first light emitting unit, the second light emitting unit and any organic color filter layer versus blue light brightness value of an organic light emitting layer provided with the first light emitting unit, the second light emitting unit and organic color filter layers.

FIG. 3 is a spectrogram of light emitted from a first light emitting unit 301 and a second light emitting unit 302 under the excitation of blue light emitted from an organic light emitting layer 200 of an OLED display panel in some embodiments of the present disclosure; and FIG. 4 is a comparison table of blue light brightness value of an organic light emitting layer 200 not provided with the first light emitting unit 301, the second light emitting unit 302 and any organic color filter layer versus blue light brightness value of the organic light emitting layer 200 provided with the first light emitting unit 301, the second light emitting unit 302 and the organic color filter layers (Blue EL+film+CF).

As can be seen from FIG. 3, under the excitation of the organic light emitting layer 200, the first light emitting unit 301 emits a pure red light at an wavelength of approximately 640 nm, and the pure red light has a relative intensity of approximately 0.02. It can be seen from the table in FIG. 4 that when the organic light emitting layer 200 is powered by a voltage of 4.5V, light from the organic light emitting layer 200 has a brightness of 627.6 cd/m2 and color coordinates of x=0.133 and y=0.0549; and after exciting the first light emitting unit 301 and the second light emitting unit 302 (as shown in FIG. 2), the blue light is not completely absorbed by the first light emitting unit 301 and the second light emitting unit 302. Therefore, additional organic color filter layers (i.e., the first color filter layer 501, the second color filter layer 502 and the third color filter layer 503) are required to filter out the residual blue light that has not been absorbed. After the addition of the organic color filter layers, the brightness of the blue light is reduced to 17.34, 26.24 and 62.03, and corresponding color coordinates are as shown in the table of FIG. 4. The brightness values of the blue light of 17.34, 26.24 and 62.03, respectively correspond to thicknesses of the organic color filter layers of 4 µm, 3 µm and 2 µm. The brightness value and the color coordinates (x, y) of the blue light are varied depending on the thickness of the organic color filter layer.

Embodiments of the present disclosure further provide a display apparatus having any of the OLED display panels provided by the above embodiments of the present disclosure.

Embodiments of the present disclosure further provide a method of fabricating an OLED display panel, including:

providing a base substrate 100;

forming, on the base substrate 100, an anode layer 201, a cathode layer 202 and an organic light emitting layer 200 between the anode layer 201 and the cathode layer 202, the organic light emitting layer 200 being configured to emit light having a third color when driven by an electric field between the anode layer 201 and the cathode layer 202;

forming, on a light emitting side of the organic light emitting layer 200, a first light emitting unit 301, a second light emitting unit 302 and a third light emitting unit 303 that are independent from each other, the first light emitting unit 301, the second light emitting unit 302 and the third light emitting unit 303 being configured to emit light having a first color, light having a second color and light having the third color, respectively, under the excitation of the light having the third color, and the light having the first color, the light having the second color and the light having the third color being configured to generate white light when being mixed.

Further, the method further includes forming a thin film encapsulation layer 400 by thin film encapsulation method, the thin film encapsulation layer 400 being configured to encapsulate the organic light emitting layer 200, and the first light emitting unit 301, the second light emitting unit 302 and the third light emitting unit 303.

Further, the step of forming, on the base substrate 100, an anode layer 201, a cathode layer 202 and an organic light emitting layer 200 between the anode layer 201 and the cathode layer 202 specifically includes forming, on the base substrate 100 and by evaporation method, the organic light emitting layer 200 covering the whole of the base substrate 100. That is, the organic light emitting layer 200 is formed on the base substrate 100 by whole-surface-evaporation method.

Further, the step of forming, on a light emitting side of the organic light emitting layer 200, a first light emitting unit 301, a second light emitting unit 302 and a third light emitting unit 303 that are independent from each other specifically includes forming the first light emitting unit 301 and the second light emitting unit 302 successively by lithography method or ink-jet printing method, and at the same time when the thin film encapsulation layer 400 is formed by thin film encapsulation method, forming the third light emitting unit 303 integrally with the thin film encapsulation layer 400 in an area corresponding to the third light emitting unit 303 by using a same material as that of the thin film encapsulation layer 400.

It should be noted here that in the method, in a case where the third light emitting unit 303 and the thin film encapsulation layer 400 are not an integral structure, the third light emitting unit 303 is formed by lithography method or ink-jet printing method.

It should be also noted that in a case where the first light emitting unit 301 and the second light emitting unit 302 are formed by lithography method, the method specifically includes:

spin-coating a photoresist doped with red quantum dots (i.e., a first transparent material) on the organic light emitting layer 200, and then performing lithographic process and post exposure baking process to form a first transparent material layer doped with red quantum dots, thus obtaining the first light emitting unit 301; and spin-coating a photoresist doped with green quantum dots (i.e., a second transparent material) on the organic light emitting layer 200, and then performing lithographic process and post exposure baking process to form a second transparent material layer doped with green quantum dots, thus obtaining the second light emitting unit 302.

It should be understood that the first light emitting unit 301 and the second light emitting unit 302 may be formed by ink-jet printing glue doped with red quantum dots and glue doped with green quantum dots, respectively.

Further, the method further includes forming an anti-reflection film layer for reducing the reflectivity of external light on a light outgoing side of the thin film encapsulation layer 400.

Further, the step of forming an anti-reflection film layer for reducing the reflectivity of external light on a light outgoing side of the thin film encapsulation layer 400 specifically includes forming, by evaporation method, lithography method or ink-jet printing method, a first color filter layer 501 in correspondence with the first light emitting unit 301, a second color filter layer 502 in correspondence with the second light emitting unit 302, and a third color filter layer 503 in correspondence with the third light emitting unit 303, successively.

By having this design, the first color filter layer 501, the second color filter layer 502 and the third color filter layer 503 may be ordinary color filter layers formed by evaporation method, ink-jet printing method, or lithography method. Optionally, the first color filter layer 501, the second color filter layer 502 and the third color filter layer 503 are formed by lithography method. In a case where the first light emitting unit 301 and the second light emitting unit 302 are formed by lithography method, the masks for fabricating the first light emitting unit 301 and the second light emitting unit 302 can be directly used for fabricating the first color filter layer 501 and the second color filter layer 502; and in a case where the first light emitting unit 301, the second light emitting unit 302 and the third light emitting unit 303 are formed by lithography method, the masks for fabricating the first light emitting unit 301, the second light emitting unit 302 and the third light emitting unit 303 can be directly used for fabricating the first color filter layer 501, the second color filter layer 502 and the third color filter layer 503, thereby reducing the cost of the masks and lowering the cost.

The above description has been given merely for preferred implementations of the present disclosure. It should be noted that various improvements and alternatives can be made by those of ordinary skill in the art without departing from the technical principles of the present disclosure, and these improvements and alternatives shall also be regarded as the protection scope of the present disclosure.

What is claimed is:

1. An organic light-emitting diode (OLED) display panel, comprising:
    a base substrate;
    an anode layer, a cathode layer and an organic light emitting layer between the anode layer and the cathode layer formed on the base substrate, the organic light emitting layer being configured to emit light having a third color;
    a first light emitting unit, a second light emitting unit and a third light emitting unit arranged on a light emitting side of the organic light emitting layer and independent from each other, and configured to emit, under the action of the light having the third color, light having a first color, light having a second color and light having the third color, respectively, the light having the first color, the light having the second color and the light having the third color being configured to generate white light when being mixed; and
    a thin film encapsulation layer configured to encapsulate the organic light emitting layer and the light emitting units,
    wherein the light having the third color is blue light, the first light emitting unit is a first transparent material layer doper with red quantum dots, the second light emitting unit is a second transparent material layer doped with green quantum dots, and the third light emitting unit is a fourth transparent material layer that is colorless, and
    wherein the third light emitting unit and the thin film encapsulation layer are formed as an integral structure and made of the same material.

2. The OLED display panel of claim 1, wherein the organic light emitting layer is an organic electroluminescent layer formed by evaporation method and having a whole layer structure covering the whole of the base substrate; and each of the first light emitting unit and the second light emitting unit is a structure of a photoluminescence layer formed by lithography method or ink-jet printing method.

3. The OLED display panel of claim 1, further comprising an anti-reflection film layer formed on a light outgoing side of the thin film encapsulation layer and configured to reduce a reflectivity of external light.

4. The OLED display panel of claim 3, wherein the anti-reflection film layer comprises:
    a first color filter layer provided in correspondence with the first light emitting unit;
    a second color filter layer provided in correspondence with the second light emitting unit; and
    a third color filter layer provided in correspondence with the third light emitting unit.

5. The OLED display panel of claim 4, wherein each of the first color filter layer, the second color filter layer and the third color filter layer is an organic color filter layer formed by evaporation method, ink-jet printing method, or lithography method.

6. A display apparatus, comprising the OLED display panel according to claim 1.

7. A method of fabricating an organic light-emitting diode (OLED) display panel, comprising:

providing a base substrate;

forming, on the base substrate, an anode layer, a cathode layer and an organic light emitting layer between the anode layer and the cathode layer, the organic light emitting layer being configured to emit light having a third color;

forming, on a light emitting side of the organic light emitting layer, a first light emitting unit, a second light emitting unit and a third light emitting unit that are independent from each other, the first light emitting unit, the second light emitting unit and the third light emitting unit being configured to emit, under the action of the light having the third color, light having a first color, light having a second color and light having the third color, respectively, the light having the first color, the light having the second color and the light having the third color being configured to generate white light when being mixed; and forming a thin film encapsulation layer by thin film encapsulation method, the thin film encapsulation layer being configured to encapsulate the organic light emitting layer and the light emitting units, wherein the steps of forming, on the light emitting side of the organic light emitting layer, the first light emitting unit, the second light emitting unit, and the third light emitting unit that are independent from each other comprises forming the first light emitting unit and the second light emitting unit successively by lithography method or ink-jet printing method, and wherein the third light emitting unit and the thin film encapsulation layer are made of a same material and are integrally and concurrently formed.

8. The method of claim 7, wherein the step of forming, on the base substrate, the anode layer, the cathode layer and the organic light emitting layer between the anode layer and the cathode layer comprises forming, on the base substrate, the organic light emitting layer covering the whole of the base substrate by evaporation method.

9. The method of claim 7, further comprising forming an anti-reflection film layer for reducing a reflectivity of external light on a light outgoing side of the thin film encapsulation layer.

10. The method of claim 9, wherein the step of forming the anti-reflection film layer for reducing the reflectivity of external light on the light outgoing side of the thin film encapsulation layer comprises forming, by evaporation method, lithography method or ink-jet printing method, a first color filter layer in correspondence with the first light emitting unit, a second color filter layer in correspondence with the second light emitting unit, and a third color filter layer in correspondence with the third light emitting unit successively.

11. An organic light-emitting diode (OLED) display panel, comprising:

a base substrate;

an anode layer, a cathode layer and an organic light emitting layer between the anode layer and the cathode layer formed on the base substrate, the organic light emitting layer being configured to emit light having a third color;

a first light emitting unit, a second light emitting unit and a third light emitting unit arranged on a light emitting side of the organic light emitting layer and independent from each other, and configured to emit, under the action of the light having the third color, light having a first color, light having a second color and light having the third color, respectively, the light having the first color, the light having the second color and the light having the third color being configured to generate white light when being mixed; and a thin film encapsulation layer configured to encapsulate the organic light emitting layer and the light emitting units, wherein the light having the third color is blue light, the first light emitting unit is a first transparent material layer doped with red quantum dots, the second light emitting unit is a second transparent material layer doped with green quantum dots, and the third light emitting unit is a third transparent material layer doped with blue quantum dots.

12. The OLED display panel of claim 11, wherein the organic light emitting layer is an organic electroluminescent layer formed by evaporation method and having a whole layer structure covering the whole of the base substrate; and each of the first light emitting unit and the second light emitting unit is a structure of a photoluminescence layer formed by lithography method or ink-jet printing method.

13. A display apparatus, comprising the OLED display panel according to claim 11.

* * * * *